United States Patent
Banjo et al.

[11] Patent Number: 5,288,698
[45] Date of Patent: Feb. 22, 1994

[54] METHOD OF POSITIONING LEAD FRAME ON MOLDING DIE TO SEAL SEMICONDUCTOR ELEMENT WITH RESIN

[75] Inventors: Toshinobu Banjo; Kouji Shika; Minoru Tanaka, all of Fukuoka, Japan

[73] Assignee: Mitsubishi Denki Kabushiki Kaisha, Tokyo, Japan

[21] Appl. No.: 858,785

[22] Filed: Mar. 27, 1992

Related U.S. Application Data

[62] Division of Ser. No. 641,397, Jan. 15, 1991, Pat. No. 5,123,823.

[30] Foreign Application Priority Data

Feb. 1, 1990 [JP] Japan ................. 2-23901

[51] Int. Cl.$^5$ ............ B29C 33/12; B29C 33/30
[52] U.S. Cl. ............ 264/40.1; 264/272.15; 264/272.17; 425/125; 425/126.1; 425/135; 425/150; 425/171
[58] Field of Search ........ 264/40.7, 40.1, 40.2, 264/272.17, 272.15; 425/544, 135, 150, 125, 126.1, 171, 116, 121, 145, 588, DIG. 228

[56] References Cited

U.S. PATENT DOCUMENTS

| | | | |
|---|---|---|---|
| 3,973,888 | 8/1976 | Hehl | 425/126.1 |
| 4,954,308 | 9/1990 | Yabe et al. | 264/272.17 |

FOREIGN PATENT DOCUMENTS

| | | | |
|---|---|---|---|
| 3507967A1 | 4/1986 | Fed. Rep. of Germany . | |
| 2628263A1 | 9/1989 | France . | |
| 56-66092 | 6/1981 | Japan . | |
| 61-99360 | 5/1986 | Japan | 425/126.1 |
| 61-229333 | 10/1986 | Japan | 425/126.1 |
| 62-70013 | 5/1987 | Japan | 425/126.1 |
| 62-193135 | 8/1987 | Japan . | |

OTHER PUBLICATIONS

"Montage Integrierter Schaltungen", H.-J. Hacke, Springer Verlag Berlin (1987), pp. 126–128.
"SMT-die neue Bestuckungstechnik fur Flachbaugruppen", D. Friedrich et al., Siemens Components 24 (1986), vol. 6, pp. 211–221.
"SMD Placement Using Machine Vision", J. Field et al., Electronic Packaging & Production (Jan. 1986) pp. 128–129.
IBM Technical Disclosure Bulletin, vol. 30, No. 10, Mar. 1988.

Primary Examiner—Jan H. Silbaugh
Assistant Examiner—A. Y. Ortiz
Attorney, Agent, or Firm—Lowe, Price, LeBlanc & Becker

[57] ABSTRACT

A reference pin (150) is provided on a bottom die (108) of a molding device (100). A lead frame (3) is carried with a chucking device (120) attached to an X-Y table mechanism (110). A hole (132) is formed in a stage (131) of the X-Y table mechanism. Respective images of the hole and the pin are detected by a TV camera (142) to control the relative position of the bottom die and the lead frame by driving the X-Y stage.

9 Claims, 8 Drawing Sheets

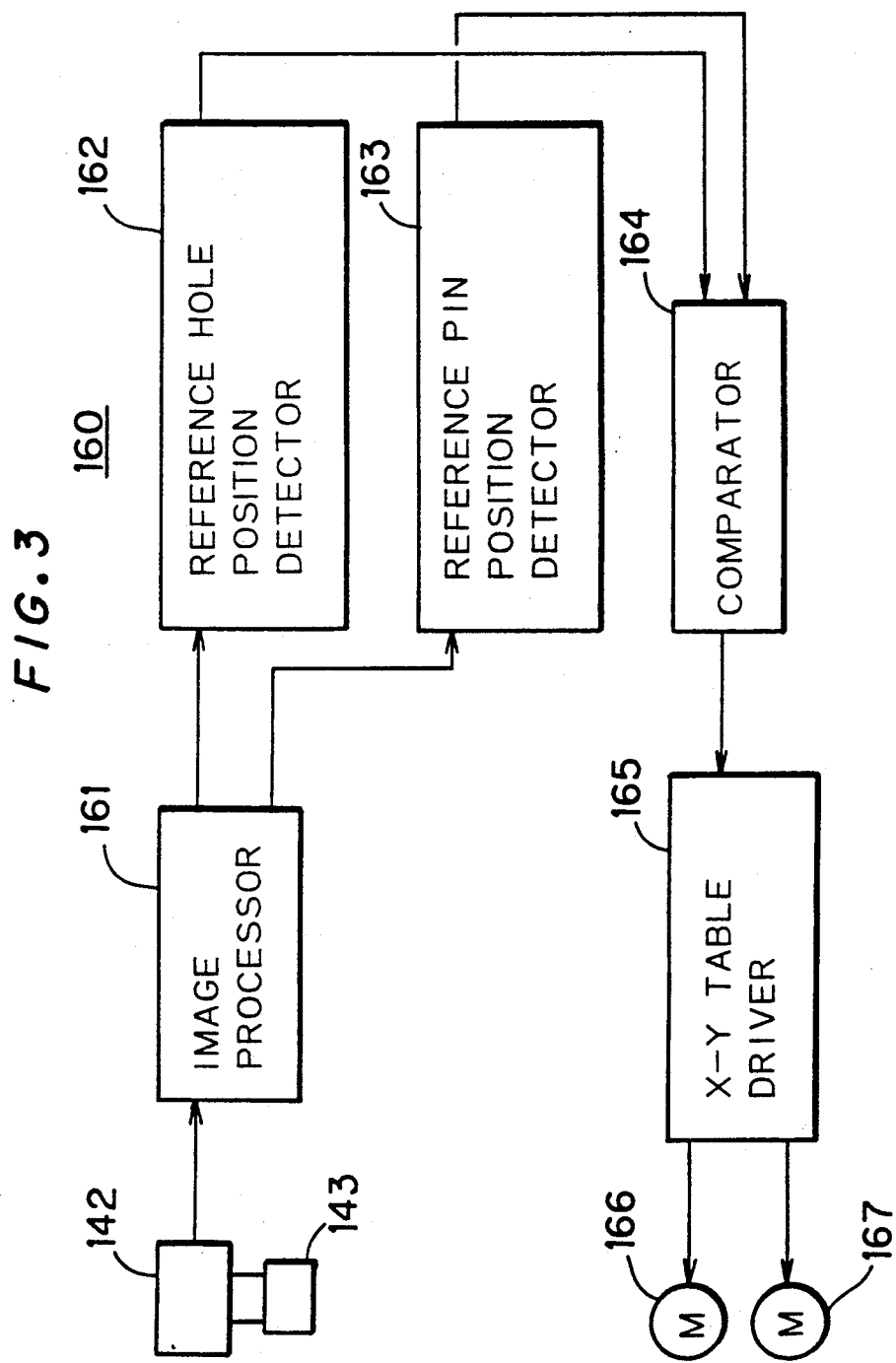

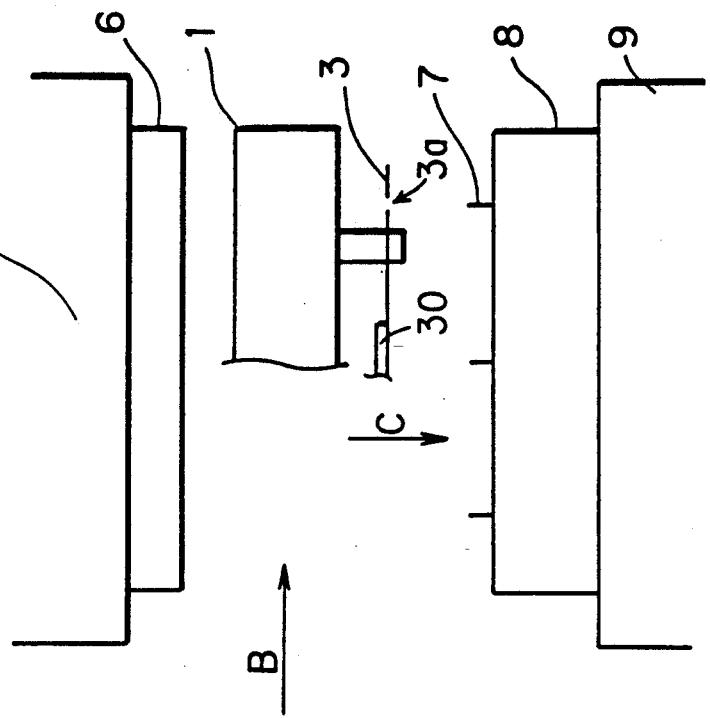
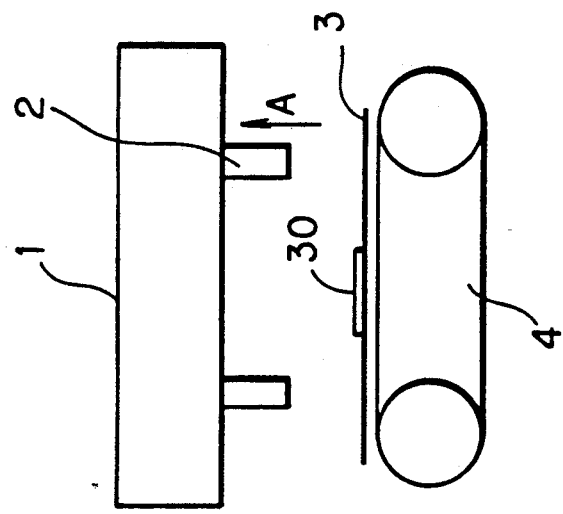
FIG. 10
PRIOR ART

METHOD OF POSITIONING LEAD FRAME ON MOLDING DIE TO SEAL SEMICONDUCTOR ELEMENT WITH RESIN

This application is a division of application Ser. No. 07/641,397 filed Jan. 15, 1991 now U.S. Pat. No. 5,123,823.

BACKGROUND OF THE INVENTION

1. Field of the Invention

The present invention relates to a molding device for sealing semiconductor element with resin and a method of positioning lead frames on a molding die, and particularly to an improvement in positional adjustment between a molding die and a lead frame on which a semiconductor element is provided.

2. Description of the Prior Arts

FIG. 10 is a conceptual side view of a conventional molding device 200 for sealing a semiconductor element with resin. The device 200 is provided with a carrier plate 1 for carrying a lead frame 3 to which a semiconductor element 30 is bonded. The lead frame 3 is electrically connected to the semiconductor element 30 through wiring therebetween. The carrier plate 1 is provided with frame chucks 2 for taking up the lead frame 3 from a loader 4.

The lead frame 3 is first supplied to the device 200 by the loader 4. The lead frame 3 is grasped by the frame chucks 2, and then the carrier plate 1 goes up with the frame chucks 2 holding the lead frame 3 as shown by an arrow A. The carrier plate 1 is moved in the horizontal direction B until the lead frame 3 reaches a gap between a top die 6 and a bottom die 8. The top and bottom dies 6 and 8 are provided on top and bottom platens 5 and 9, respectively. Positional adjustment pins 7 are planted on the bottom die 8.

When the lead frame 3 reaches a position at which positioning holes 3a of the lead frame 3 are just above the positional adjustment pins 7, the movement of the carrier plate 1 in the direction B is stopped and then the carrier plate 1 goes down as shown by an arrow C. Consequently, the position adjustment pins 7 are inserted into holes 3a and positional alignment of the lead frame 3 to the dies 6 and 8 is attained. The chucks 2 are opened and then the carrier plate 1 goes back to the original position thereof. The top die 6 goes down and an operation for sealing the semiconductor element 30 with resin is then conducted.

In the operation of placing the lead frame 3 on the bottom die 8, however, the lead frame 3 often goes down onto the bottom die 8 without inserting the pins 7 into the holes 3a because of mechanical shock in the stop motion and thermal expansion of materials forming the lead frame 3 and the device 200. When such an error is caused, a package of the semiconductor element which is formed of resin is deviated from a predetermined position on the lead frame 3, and as a result, a defective semiconductor device is obtained. Furthermore, when the dies 6 and 8 are closed with the semiconductor element 30 inserted therebetween, the semiconductor element 30 on the lead frame 3 comes in contact with a wall in the cavity of the die 6 or 8, so that the die is damaged by the semiconductor element 30. In order to prevent these disadvantages, it has been desired to develop a device in which the lead frame 3 is positioned on the die 8 accurately.

Furthermore, the stop position of the carrier plate 1 must be re-adjusted when the type of semiconductor devices is changed, and long time is required in the conventional device 200 for the re-adjustment.

SUMMARY OF THE INVENTION

The present invention is directed to a device for sealing with resin a lead frame on which a semiconductor element is bonded.

According to the present invention, the device comprises: (a) a bottom die; (b) a top die located above the bottom die and movable toward the bottom die; (c) a pin planted at an end position on a top surface of the bottom die; (d) holding means for holding the lead frame; (e) a plate member coupled to the holding means and having a vertical through hole at an end region of the plate member; (f) X-Y driver means for driving and moving the plate member and the holding means in horizontal X-Y directions; (g) carrier means for carrying the plate member and the holding means holding the lead frame to a gap space between the top die and the bottom die and for placing the lead frame on the bottom die so that the semiconductor element is aligned with the top and bottom dies; (h) image detector means connected to the plate member and operable to detect respective images of the hole and the pin and generate an image signal representing the images when the plate member is inserted into the gap space; (i) control means for receiving the image signal and generating a control signal of the X-Y driver means so that the hole and the hole are aligned; and (j) means for supplying resin into a cavity formed between the and top and bottom dies after the top die goes down to the bottom die and the semiconductor element is accommodated in the cavity.

Preferably, the hole has a diameter larger than a diameter of the pin. In a preferred embodiment of the present invention, the hole is a circular hole and the pin is a circular pin.

The pin may be an anisotropic pin. In this case, the device is further provided with: (k) a rotational driver means inserted between the plate member and the X-Y driver means and operable to rotate the plate member horizontally, and the control means comprises: (i-1) means for receiving the image signal to detect an angle representing a rotational angle of the pin in an image window of the image detector means; and (i-2) means for generating a control signal for enabling the rotational driver means to rotate the plate member and to attain rotational alignment of the pin and the hole.

The present invention is also directed to a method of positioning lead frame on a molding die to seal the lead frame with resin. A semiconductor element is bonded on a lead frame.

According to the present invention, the method comprises the steps of: (a) preparing a die having a top surface at an end position of which a pin is planted; (b) preparing X-Y driver means provided with a horizontal plate member under which holding means for holding the lead frame is attached, wherein the X-Y driver means is operable to drive and move the plate member in horizontal X-Y directions and the plate member has a vertical through hole at an end region of the plate member; (c) holding the lead frame by the holding means; (d) carrying the X-Y driver means to a space on the die together with the plate member and the holding means holding the lead frame; (e) detecting respective images of the hole and the pin by an image detector coupled to the plate member to generate an image signal; (f) detecting positional deviation between the respective images on the basis of the image signal; (g) enabling the X-Y driver means in accordance with the deviation to align the hole and the pin; and (h) releasing the lead frame from the holding means to place the lead frame on the die.

Accordingly, an object of the present invention is to provide a device for sealing a semiconductor element with a resin in which a lead frame of the semiconductor element is accurately supplied onto a die.

Another object is to provide a method of accurately positioning a lead frame on a molding die.

Another object is to easily re-adjust a position on a die to which a lead frame is placed, when type of semiconductor devices is changed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a block diagram of a controller provided for the molding device in FIG. 1;

FIG. 6 is a plane view of the device in a direction Q—Q in FIG. 5;

FIG. 10 is a conceptual side view of a conventional molding device.

DESCRIPTION OF THE PREFERRED EMBODIMENTS

Figure 1:
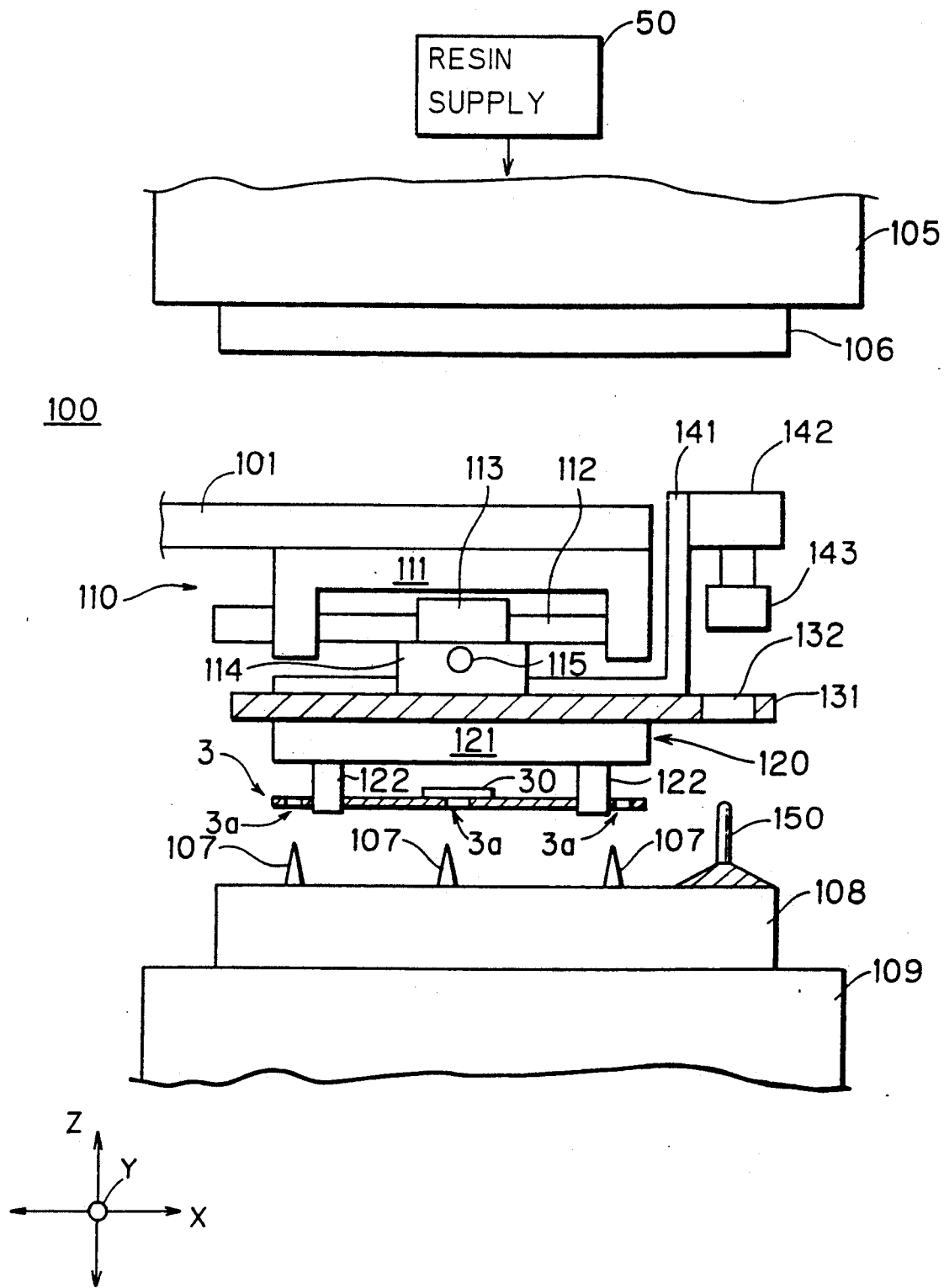
FIG. 1 is a partial side view of a molding device according to a preferred embodiment of the present invention.

FIG. 1 is a side view of a molding device 100 according to a preferred embodiment of the present invention. The device 100 is usable for sealing an semiconductor element 30 with resin. The semiconductor element 30 is bonded and electrically connected to a lead frame 3. Although only one semiconductor element 30 is shown in FIG. 1, a plurality of semiconductor elements may be arrayed and bonded to the lead frame 3. The lead frame 3 is provided with positional adjustment holes 3a.

The molding device 100 comprises a carrier plate 101 for carrying the lead frame 3. An X-Y table mechanism 110 has a body member 111 attached to the bottom surface of the carrier plate 101. A guide rod 112 extending in a direction X is supported by the body member ill and a moving member 113 is coupled to the guide rod 112 movably in the direction X. Another moving member 114 is coupled to the moving member 113 through another guide rod 115 extending in a direction Y. The moving member 114 is movable in the direction Y. These elements 111-115 form an X-Y stage driver.

A frame chucking device 120 is attached to the bottom surface of the moving member 114 through a horizontal stage member 131. A circular reference hole 132 is formed at an end region of the stage member 131. The chucking device 120 comprises a body box 121 in which a mechanism for driving chuck fingers 122 is provided. The chuck fingers 122 are operable to grasp and release the lead frame 3.

A top die 106 and a bottom die 108 are provided at a top space and a bottom space, and are coupled to a top platen 105 and a bottom platen 109, respectively. The top die 106 can go down onto the bottom die 108. The device 100 further comprises a mechanism 50 for supplying resin or plastic to a cavity formed when the dies 106 and 108 are closed. Such a supply mechanism is well-known in the art, and is connected to the die 106.

Positional adjustment pins 107 are planted on the top surface of the bottom die 108. The pins 107 are positioned at end regions of the bottom die 108, and therefore, it is prevented that the top die 106 comes in contact with the pins 107 when the top die 106 goes down. The pins 107 fit in with the positional adjustment holes 3a.

A reference pin 150 is planted at another end region on the top surface of the bottom die 108. The reference pin 150 is a cylindrical or circular pin which has a diameter smaller than the diameter of the reference hole 132. The chucking device 120 and the stage member 131 are movable in the directions X and Y in accordance with movement of the moving member 114, and when these members 131 and 120 are moved to the position shown in FIG. 1, the reference pin 150 comes to face the reference hole 132. The positions of the reference pin 150 and the reference hole 132 is previously determined so that respective centers of the pin 150 and the hole 132 in the horizontal direction can be coincident with each other when the horizontal position of the lead frame 3 is a normal position in the device 100 at which the semiconductor element 30 can be correctly received between the dies 106 and 108.

A hook-shaped arm 141 is fixed to the moving member 115 and the stage 131 and extends in the direction Z at a side space of the X-Y table mechanism 110. A TV camera 142 is attached to and supported by the arm 141. The TV camera 142 is oriented toward the downward direction and is operable to detect respective images of the reference hole 132 and the reference pin 150 through a lens 143. The module consisting of the carrier plate 101, the X-Y table mechanism 110 and the other members connected to the X-Y table 120 are movable in the vertical direction Z as well as in the horizontal directions X and Y by a driving mechanism (not shown). Although it is not shown in FIG. 1, a loader similar to the loader 4 in FIG. 10 is also provided in the device 100.

The device 100 is provided with an electric controller and details thereof will be described later.

Figure 2:
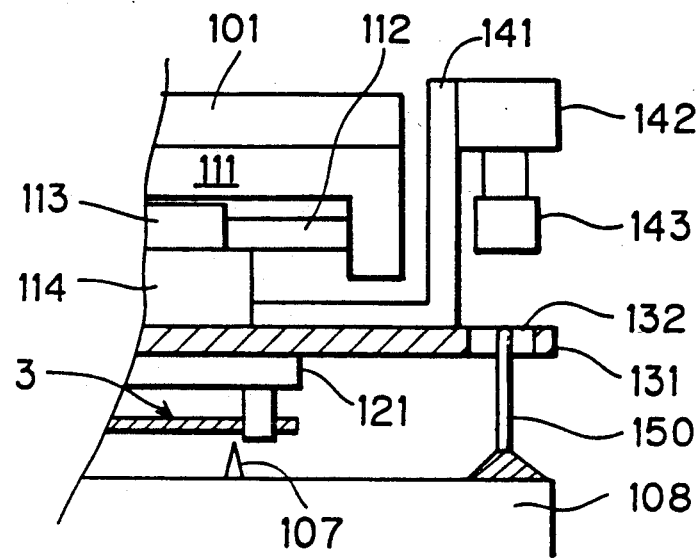
FIG. 2 is a partial view showing an operation of the molding device in FIG. 1.
Figure 4:
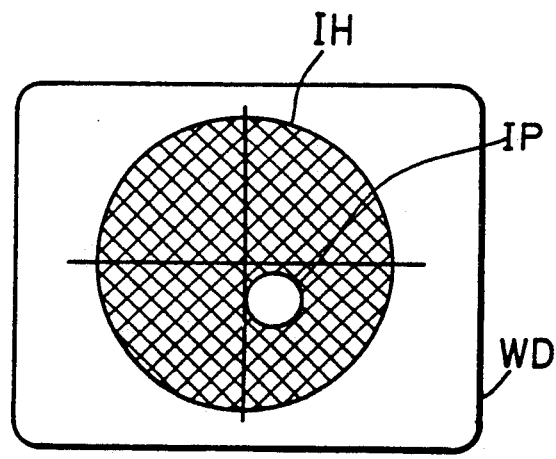
FIG. 4 is a block diagram showing a controller employed in the preferred embodiment.

The device 100 operates as follows: First, the lead frame 3 having the semiconductor element 30 is supplied by the loader and is grasped between the chuck fingers 122 at a side space of the bottom die 108, similarly to the device 200 in FIG. 10. Then the carrier plate 101, together with the X-Y table mechanism 110 and the chuck device 120 holding the lead frame 3, is moved into the space between the dies 106 and 108. FIG. 1 shows this state, in which the TV camera 142, the lens 143, the reference hole 132 and the reference pin 150 are approximately aligned in the direction Z. However, the position of the hole 132 may be deviated from the position of the pin 150 in the horizontal direction X and/or Y. The carrier plate 101 then goes down toward the bottom die 108. FIG. 2 shows a state in which the top end of the pin 150 is inserted into the hole 132 in accordance with the descent of the carrier plate 101 and the stage 131. If the center of the hole 132 is deviated from that of the pin 150 in a horizontal direction, the positional deviation between the hole 132 and the pin 150 is corrected through the following operation:

As shown in FIG. 4, the TV camera 142 photoelectrically reads or detects the image IH of the reference hole 132 and the image IP of the reference pin 150 in an image window WD of the TV camera 142. The image signal representing these images IH and IP is transmitted to an image processor 161 (FIG. 3) provided in a controller 160 of the device 100. The image processor 161 is operable to binarize the image signal and eliminate noises therefrom. The image signal is then transmitted to a reference hole position detecting circuit 162 and a reference pin position detecting circuit 163. The hole position detecting circuit 162 detects the position of the hole image IH in the image window WD, while the pin position detecting circuit 163 detects the position of the pin image IP in the image window WD. The respective position of the images IH and IP are compared with each other in a comparator 164, so that positional deviation between the respective center position of the images IH and IP is calculated.

The comparator 164 generates a deviation signal representing the amount of the deviation, which is delivered to an X-Y table driver 165. The driver 165 generates a driving power in proportion to the deviation. The power is delivered to motors 166 and 167 which are provided in the X-Y table mechanism 110 for moving the members 113 and 114. The delivery of the power is continued until the deviation becomes substantially zero. In other words, a closed loop control is conducted in connection with the deviation between respective center-positions of the images IH and IP. The X-Y table mechanism 110 drives the moving member 114, and therefore, the stage member 131 and the lead frame 3 are moved in the direction X and/or Y until the center of the hole 132 reaches the position of the pin 150.

The carrier plate 101 further goes down toward the bottom die 108 and the lead frame 3 is placed on the bottom die 108, so that the semiconductor element 30 is aligned with the dies 106 and 108. The pins 107 are inserted to the holes 3a of the lead frame 3. Then, the chuck fingers 122 release the lead frame chucking device 3. The carrier plate 101 and the members connected thereto go up and leave the space between the dies 106 and 108 to the initial position thereof. The top die 106 goes down until the top die 106 comes in contact with the bottom die 108, and the semiconductor element 30 is accommodated in the cavity formed between the dies 106 and 108. Melted resin is supplied from the supply mechanism 50 to the cavity between the dies 106 and 108 and then is cured. The top die 106 goes up and a semiconductor module in which the semiconductor element 30 on the lead frame 3 is sealed with resin is obtained.

In the preferred embodiment, positional deviation between the pin 150 and the hole 132 in the horizontal direction is automatically corrected, and accordingly, positional adjustment of the lead frame 3 in the space between the dies 106 and 108 is automatically attained. This operation is conducted every time a lead frame is supplied to the molding device 100. Therefore, it is prevented that semiconductor devices thus obtained become defective. As a result, yield of semiconductor devices is improved. Furthermore, manual operation for re-adjusting the position at which lead frames are set on the die 108 is not required even when the type or size of semiconductor elements and lead frames is changed. This is because recognition of a reference hole is attained automatically, and lead frames are always placed at optimum positions on the die 108.

Figure 5:
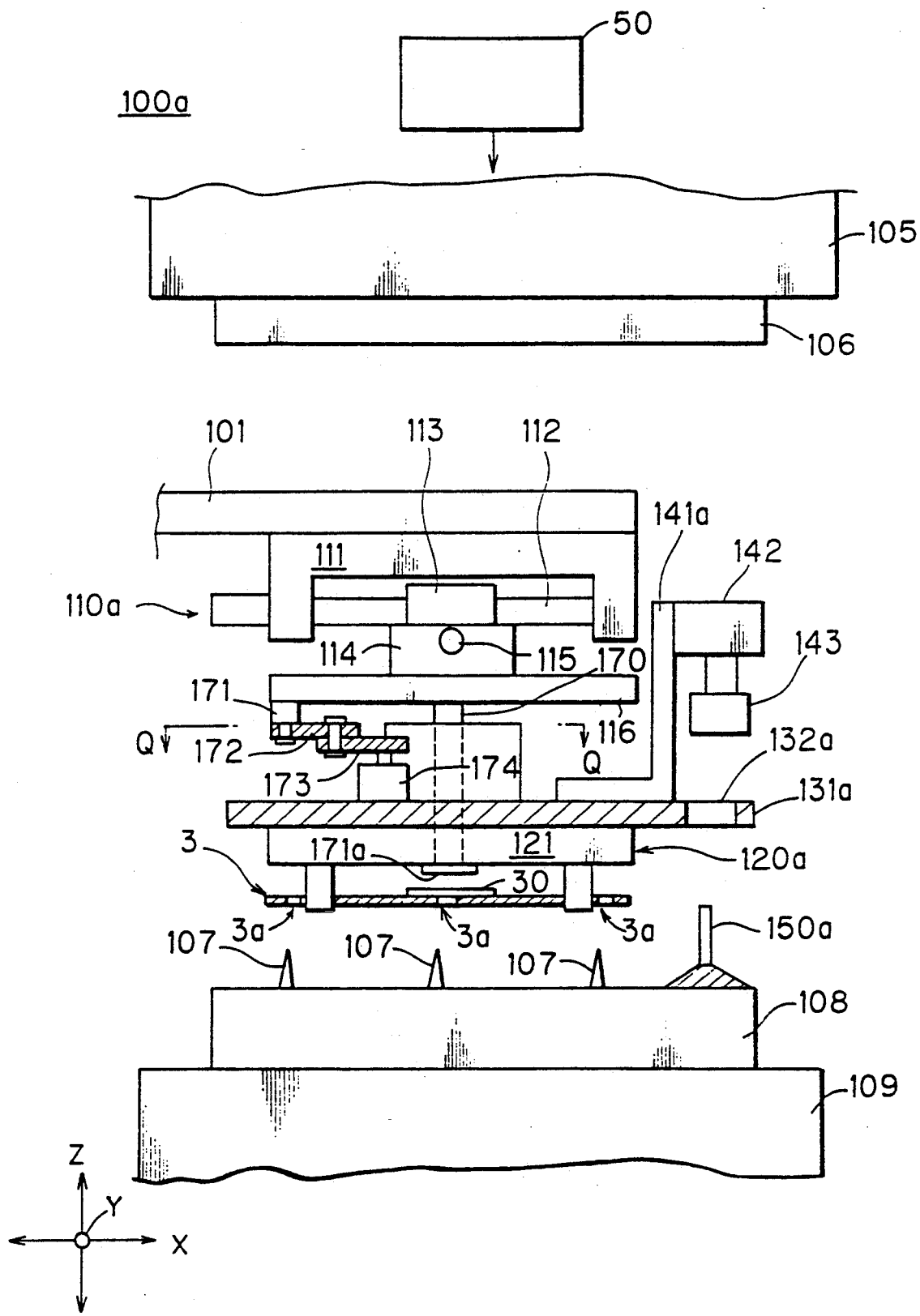
FIG. 5 is an explanatory views showing an image detected by a TV camera.

FIG. 5 is a side view of a molding device 100a according to another preferred embodiment of the present invention. In this embodiment, an X-Y stage 116 is fixed to the moving member 114, and a rod 170 is attached to the center in the bottom surface of the X-Y stage 116. The lower end of the rod 170 is rotatably inserted into holes provided in a horizontal plate member 131a and a chucking body box 121. The bottom end of the rod 170 is provided with a stopper head 170a. The horizontal plate member 131a is fixed to the chucking body box 121.

Figure 6:
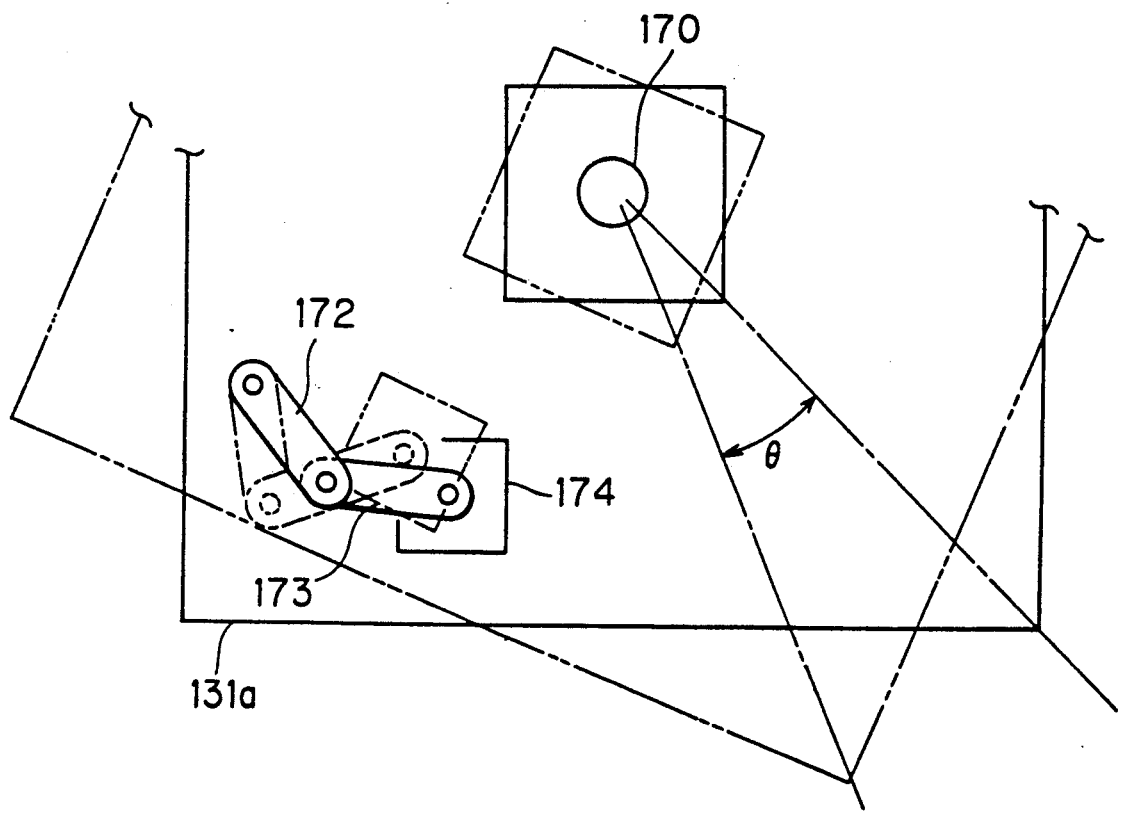
FIG. 6 is a partial side view of a molding device according to another preferred embodiment of the present invention.

FIG. 6 is a plane view in the direction Q—Q shown in FIG. 5. Referring to FIGS. 5 and 6, a motor unit 174 is provided on the plate member 131a. The position at which the motor unit 174 is fixed is deviated from the position of the rod 170. A couple of links 172 and 173 is provided between the motor unit 174 and a supporting pin 171 is fixed to the stage 116. When the motor unit 174 is enabled, the rotor thereof actuates the links 172 and 173 and the plate 131a is rotated as shown by imaginary lines in FIG. 6. When the rotor of the motor unit 174 is rotated in a reverse direction, the plate 131a is also rotated in a reverse direction.

Referring to FIG. 5 again, a square reference hole 132a is formed in an end region of the plate member 131a and a square reference hole 132a is employed in place of the cylindrical pin 150 in FIG. 1. In general, pins and holes having anisotropic sections can be employed as the reference pin and the reference hole. Examples thereof are:

a rectangular pin and a rectangular hole;
a polygonal pin and a polygonal hole; and
an elliptic pin and an elliptic hole.

The square reference pin 150a and the square reference hole 132a are one of rectangular pins and rectangular holes.

A hook-shaped arm 141a is fixed to the plate 131a and a TV camera 142 is supported by the arm 141. The TV camera 142 is operable to detect respective images of the hole 132a and the pin 150a. The other mechanical structure of the device 100a is the same as the device 100 in FIG. 1.

Figure 7:
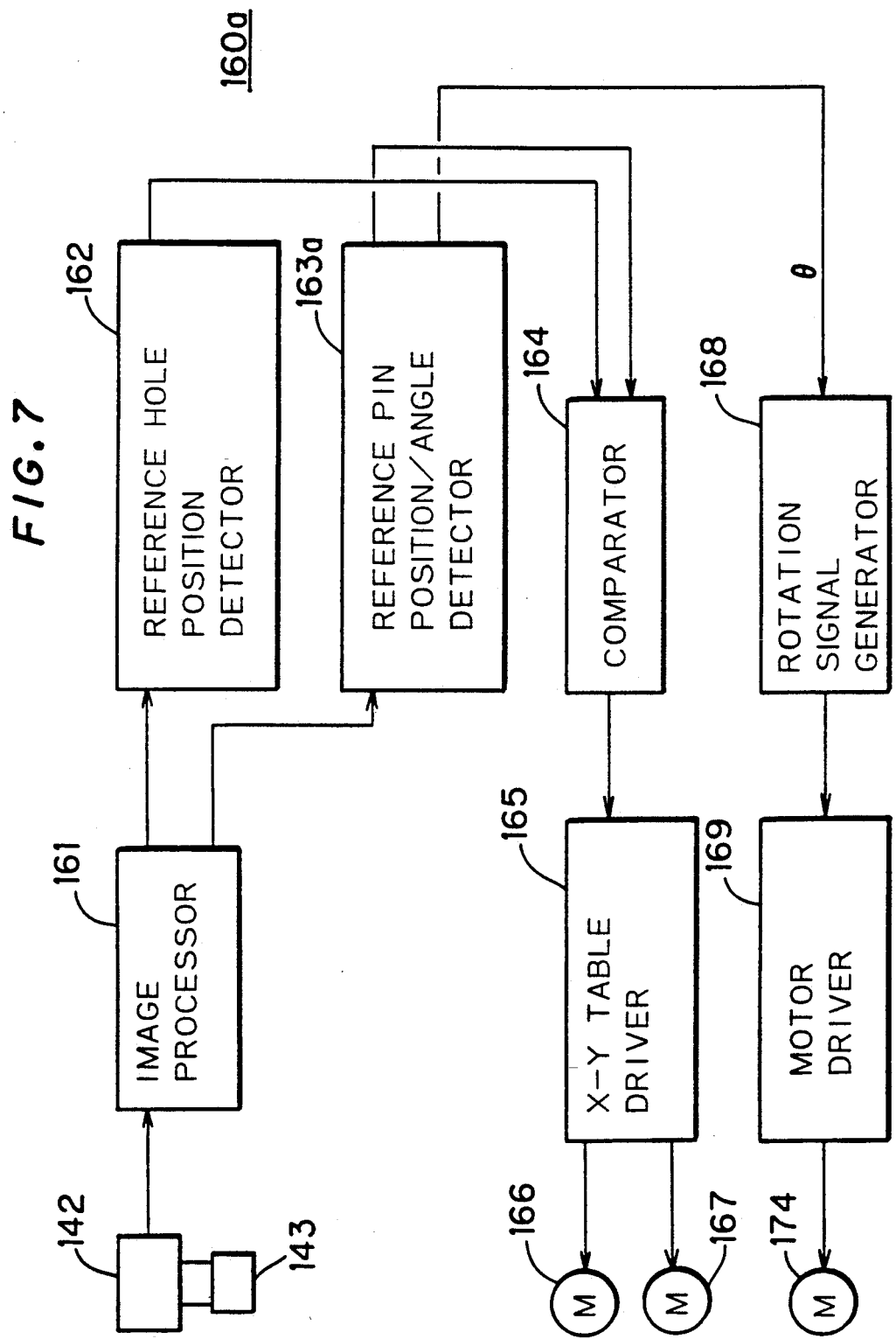
FIG. 7 is a block diagram of a controller provided for the molding device in FIG. 5.

FIG. 7 is a block diagram of a controller 160a provided for the molding device in FIG. 5. As understood by comparing FIG. 7 with FIG. 3, the controller 160a has a reference pin position/angle detecting circuit 163a in place of the reference pin position detecting circuit 163 in FIG. 3. Furthermore, a rotation signal generator 168 and a motor driver 169 for driving the motor 174 is additionally provided.

Figure 8:
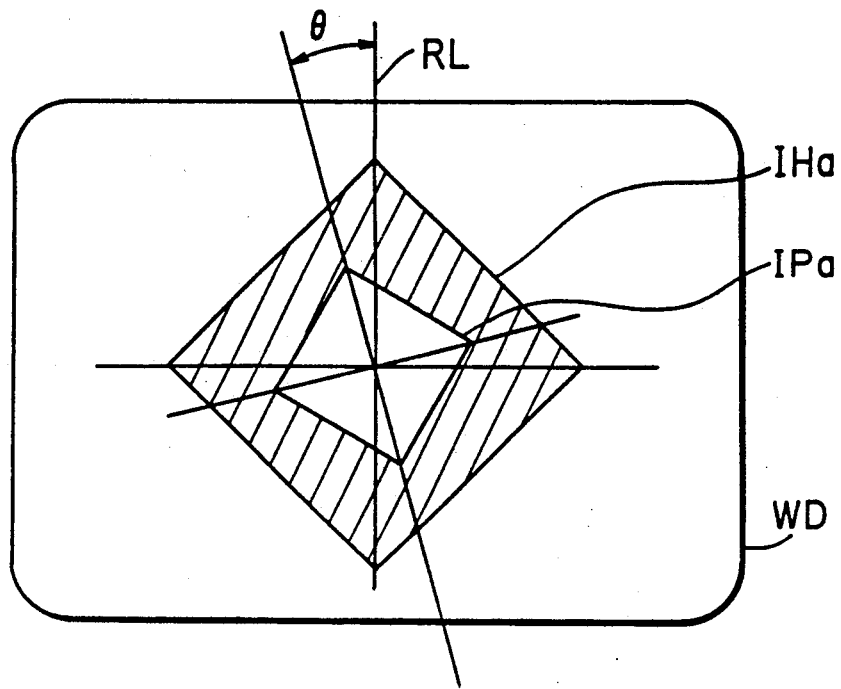
FIGS. 8 and 9 are explanatory views showing images detected by a TV camera.

FIG. 8 illustrates images detected by the TV camera 142 in the device 100a, in which a hole image IHa and a pin image IPa representing the pin 150a and the hole 132a, respectively, are shown. An image signal from the TV camera 142 is delivered to the hole position detecting circuit 162 and the pin position/angle detecting circuit 163a.

The hole position detecting circuit 162 detects the center position of the hole image IHa, while the pin position/angle detecting circuit 163a detects the center position of the pin image IPa and an angle θ which is the inclination angle of the pin 150a from a vertical reference line RL defined in the image window WD of the camera 142. The vertical reference line RL is an imaginary one and corresponds to a diagonal line of the square section of the pin 150a. The angle θ represents rotational deviation from an optimum arrangement of the hole 132a and the pin 132a, or that of the plate 131a and the die 108. If the angle θ is not zero, it is indicated that the lead frame 3 is not aligned to the die 108 in rotational arrangement on a horizontal plane. Since the relative rotation angle between the hole 132a and the camera 142 (i.e., the relative rotation angle between the image window WD and the hole image IHa) is fixed, the angle θ can be detected from the image IPa of the pin 132a only.

Figure 9:
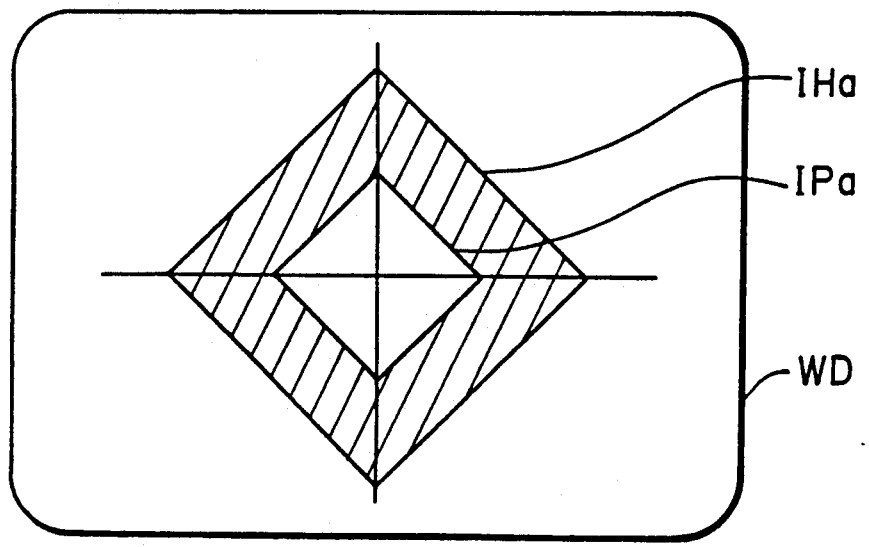

The positional deviation between respective center positions of the images IHa and IPa is calculated by the comparator 164 and the deviation signal generator 166, and is used for closed-loop control of the X-Y table 120 as in the case of the device 100 in FIG. 1. On the other hand, signal representing the angle θ is transmitted to the rotation signal generator 168. The rotation signal generator 168 generates a signal and delivers the same to the motor driver 169 for driving the motor unit 174. Consequently, the plate 131a and the chucking device 120 holding the lead frame 3 are rotated by the angle θ as shown in FIG. 6 so that the angle θ becomes substantially zero (see FIG. 9). As a result, the lead frame 3 is aligned to the die 108 in both of their positions and angles, and the lead frame 3 is placed on the die 108 accurately. Other operations of the device 100a are the same as the device 100 in FIG. 1.

According to the device 100a, both of the positional or translational deviation and the rotational deviation between the lead frame 3 and the die 108 are corrected automatically. Therefore, accuracy in the positional adjustment of the lead frame 3 and the dies 106 and 108 is further improved.

A gear mechanism, a ball screw mechanism and the like may be employed in place of the link mechanism. Further, since the positional relation between the TV camera 142 and the plate member 131a is fixed and the relative rotation angle of the hole image IHa in the image window WD is not changed, the angle θ can be detected even if the reference pin is an anisotropic pin and the reference hole is a circular hole. When both of the pin and the hole are anisotropic ones as in the embodiment in FIG. 5 and it is desired to further increase the accuracy in the control, the detector 162 in FIG. 7 may be replaced by a reference hole position/angle detector operable to detect not only the position of the hole image IHa but also the angle by which the hole image IHa is inclined from a reference direction in the image window WD. In this case, a subtractor is provided in the controller 160a and the difference between the two angles, one of which is the rotation angle of the pin image IPa and the other is a rotation angle of the hole image IHa in the horizontal plane, are calculated to obtain the relative rotation angle θ.

Although the present invention has been described and illustrated in detail, it is clearly understood that the same is by way of illustration and example only and is not to be taken by way of limitation. The spirit and scope of the present invention should be limited only by the terms of the appended claims.

We claim:

1. A method of positioning a lead frame on a molding die to seal said lead frame with resin, wherein a semiconductor element is bonded on said lead frame, said method comprising the steps of:
   (a) preparing a die having a top surface at an end position of which a pin is planted;
   (b) preparing X-Y driver means provided with a horizontal plate member under which holding means for holding said lead frame is attached, wherein said X-Y driver means is operable to two-dimensionally drive and move said plate member in horizontal X-Y directions and said plate member has a vertical through hole at an end region of said plate member;
   (c) holding said lead frame by said holding means;
   (d) carrying said X-Y driver means to a space on said die together with said plate member and said holding means holding said lead frame;
   (e) detecting respective two-dimensional images of said hole and said pin by a two-dimensional-image detector coupled to said plate member to generate an image signal representative of said respective two-dimensional images;
   (f) detecting two-dimensional positional deviation between said respective images by comparing image portions based on said image signal with each other;
   (g) enabling said X-Y driver means in accordance with said deviation to two-dimensionally align respective positions of said hole and said pin in said horizontal directions; and
   (h) releasing said lead frame from said holding means to place said lead frame on said die.

2. The method of claim 1, wherein: said hole has a diameter larger than a diameter of said pin.

3. The method of claim 1, wherein: said hole is a circular hole; and said pin is a cylindrical pin.

4. A method of positioning a semiconductor lead frame with at least one positional adjustment hole, on a molding die prior to sealing said lead frame with resin, means for positioning said lead frame including a die member with a reference pin and at least one positional adjustment pin, holding means for releasably grasping said lead frame, a horizontal plate member with a reference hole, under which said holding means is located, an x-y driver for moving said horizontal plate member in x-y directions in the plane of said horizontal plate member, and an imaging system with imaging means and imaging circuitry means;

said method comprising the steps of:
   (a) grasping said lead frame with said holding means;
   (b) operating said x-y driver to move said horizontal plate to a position above said die;
   (c) forming images of said reference pin and said reference hole with said imaging means;
   (d) processing said images with said image circuitry means to form a positional deviation signal representative of a positional difference between said reference pin and said reference hole;
   (e) enabling said x-y driver according to said positional deviation signal, so as to correctly position said horizontal plate with said die; and
   (f) lowering said lead frame on to said die.

5. A method of positioning lead frame on a molding die to seal said lead frame with resin, wherein a semiconductor element is bonded on said lead frame, said method comprising the steps of:

(a) preparing a die having a top surface at an end position of which an anisotropic pin is planted;

(b) preparing X-Y driver means provided with a horizontal plate member under which holding means for holding said lead frame is attached, wherein:

said X-Y driver means is operable to two-dimensionally drive and move said plate member in horizontal X-Y directions and is operable to rotate in a horizontal plane; and said plate member has a vertical anisotropic through hole at an end region of said plate member;

(c) holding said lead frame by said holding means;

(d) carrying said X-Y driver means to a space on said die together with said plate member and said holding means holding said lead frame;

(e) detecting respective two-dimensional images of said hole and said pin by a two-dimensional-image detector coupled to said plate member to generate an image signal representative of said respective two-dimensional images;

(f) detecting two-dimensional translational deviation and rotational deviation between said respective images by comparing image portions based on said image signal with each other;

(g) enabling said X-Y driver means in accordance with said translational deviation and said rotational deviation to two-dimensionally align respective positions of said anisotropic hole and said anisotropic pin in said horizontal directions and to adjust respective angles of said anisotropic hole and said anisotropic pin; and (h) releasing said lead frame from said holding means to place said lead frame on said die.

6. A method of claim 5, wherein:

the step (f) comprises the steps of:

(f-1) detecting an angle representing a rotational angle of said pin in an image window of said image detector on the basis of said image signal; and the step (g) comprises the steps of:

(g-1) rotating said plate means in a horizontal plane to reduce said angle.

7. A method of claim 6, wherein:
said hole is an anisotropic hole.

8. A method of claim 7, wherein:
said hole is a rectangular hole; and
said pin is a rectangular pin.

9. A method of claim 8, wherein:
said hole is a square hole; and
said pin is a square pin.

* * * * *